United States Patent [19]

Douthitt et al.

[11] Patent Number: 5,524,280
[45] Date of Patent: Jun. 4, 1996

[54] METHOD OF ACQUIRING A CHANNEL IN A GENERAL FREQUENCY REUSE SYSTEM

[75] Inventors: Brian L. Douthitt; Russ M. Rupolo, both of Bothell, Wash.; Stephen Sek, Lake In The Hills, Ill.

[73] Assignee: Motorola, Inc., Schaumburg, Ill.

[21] Appl. No.: 332,298

[22] Filed: Oct. 31, 1994

[51] Int. Cl.⁶ .......................... H04B 15/00; H04B 17/00
[52] U.S. Cl. ...................... 455/62; 455/33.1; 455/56.1
[58] Field of Search ........................... 455/33.1, 33.2, 455/33.4, 34.2, 56.1, 62, 67.1, 161.2, 161.3, 166.1, 166.2

[56] References Cited

U.S. PATENT DOCUMENTS

| | | |
|---|---|---|
| 4,481,670 | 11/1984 | Freeburg . |
| 4,723,302 | 2/1988 | Fulmer et al. ............... 455/161.2 |
| 5,093,926 | 3/1992 | Sasuta ............................ 455/62 |
| 5,212,803 | 5/1993 | Uddenfeldt et al. ........... 455/161.3 |
| 5,261,117 | 11/1993 | Olson ............................ 455/166.2 |

*Primary Examiner*—Edward F. Urban
*Assistant Examiner*—Marsha D. Banks-Harold
*Attorney, Agent, or Firm*—Charles W. Bethards

[57] ABSTRACT

In a general frequency reuse data communications system including infrastructure 100 and a subscriber terminal 115 a method of acquiring a channel includes: fast scanning 199 a predetermined list of data channels to identify a fast scanned channel; intermediate scanning 200, when the fast scanned channel is not identified, the predetermined list of channels to identify an intermediate scanned channel where a channel from the predetermined list of channels is evaluated for a first time period; and slow scanning 500, when the intermediate scanned channel is not identified, the predetermined list of channels to identify a slow scanned channel where a channel from the predetermined list of channels is evaluated for a second time period.

25 Claims, 8 Drawing Sheets

METHOD OF ACQUIRING A CHANNEL IN A GENERAL FREQUENCY REUSE SYSTEM

FIELD OF THE INVENTION

The present disclosure concerns various subscriber roaming attributes and techniques and more particularly but not limited to such attributes, specifically concerning methods of acquiring a channel in a general frequency reuse system.

BACKGROUND OF THE INVENTION

As our society becomes more mobile and information dependent the demand for untethered data communications continues to grow. A proliferation of radio data communications systems have been, are being, or will be deployed in an attempt to satisfy this demand. To no ones surprise, these systems, while often occupying or providing coverage to overlapping geographic areas and user groups, do not always lend themselves to providing, alternatively, relatively seamless data message delivery service to a particular subscriber's unit or terminal.

The systems, as deployed and planned, have sought to optimize different criteria depending on the system designers perception of what user groups needs are intended to be addressed by a particular radio data communications system. Such criteria have included various combinations of data message delivery capacity and delivery reliability, conservation of radio frequency spectrum, the economics of system deployment and expansion, and the extent of the desired geographic coverage. The process of optimization often relies on or takes advantage of expected or measured characteristics and content of data messages that are representative of probable system traffic. As a result of the above considerations at least two distinct types of systems, often referred to as a single frequency and multiple frequency reuse systems respectively, have evolved to provide data message delivery to user groups throughout a geographic area. This evolution is such that the present infrastructure from a collective or macro perspective for any one populous geographic region is now often referred to as a general frequency reuse system.

While distinct, both systems include some similar elements, functions, or characteristics. For example, both systems (networks) likely are centrally managed under the control of a network controller and include a plurality of fixed (base) stations arranged and managed to provide data message delivery to subscriber units or stations (portable or mobile terminals) throughout a geographic area. The network controller includes, among others, a data message routing function for selecting the appropriate path or point of origination, such as a base station, to attempt a data message delivery to a particular subscriber station. This path selection will depend in part on an estimate of the geographic location of the particular subscriber station or other system activity and may include when to attempt a data message delivery, which base station to utilize, and therefore, or additionally, which radio channel (a radio channel may represent two radio frequencies, one for receive and one for transmit).

One of these systems, referred to as a multi-frequency reuse (MFR) system, is characterized by typically comparatively small coverage areas with adjacent areas employing different radio channels, thus frequencies, and spatially distant areas reusing the same radio channels. The areas in total provide coverage throughout the intended MFR geographic area. Ordinarily the fixed stations, at least one per area, in this system are continuously transmitting and receiving and subscriber stations, such as portable or mobile stations or units are capable of operating on any legitimate and authorized network channel. The portable stations, by scanning the network channels, etc., can determine or aid in determining their location within the intended MFR geographic area on a more or less real time basis by observing the better quality channels based on signal strength, error rates, etc. The MFR network, although using several radio channels and thus frequencies, can provide significant data message delivery capacity since all areas may be simultaneously and independently active. Said another way, any path within the MFR system will, at least in principle, have a unique radio channel, i.e. frequency or frequency pair.

The second system, referred to as a single frequency reuse (SFR) system, is characterized by a multiplicity of coverage areas where all areas and potential paths are served by the same radio channel. As above, the areas in total provide coverage throughout the intended SFR geographic area. The fixed stations, usually one per area, in the SFR system are not ordinarily all simultaneously and independently active. To demonstrate, since all areas and paths operate on the same radio channel any two or more areas, when simultaneously active (respective fixed stations transmitting), will have an interference region. This region's geographic size and boundary will depend in part on the spatial separation, radio power levels, etc., of the respective base stations. Within this interference region a given portable station likely cannot resolve (successfully receive) a data message from either of the stations unless some further coordination of the base stations is undertaken.

In essence the effective coverage area depends at least in part on activity within other areas of the SFR system. Portable stations used in the SFR system need only operate on the assigned channel for the network and will not be able to directly aid in determining their location within the intended SFR geographic area unless and until an appropriate fixed station is enabled and uniquely identified. The SFR network tends to be viewed as a spectrally efficient and cost effective approach to providing coverage to a comparatively large geographic area. This follows from the limited number of frequencies employed and comparative simplicity of the portable stations, etc. Somewhat offsetting the above noted attributes, resulting from the single channel, interference regions, etc., a SFR system will typically have relatively limited data message delivery capacity and often more complicated data message routing functions.

The characteristics of either of these systems much less the characteristics of a combined system together with the growing popularity of data communications and hence number of subscriber units or stations or terminals mandates that the practitioner in the field pay careful attention to the particulars of a subscriber unit roaming from one geographic area to a second geographic area within a given system or roaming from one system to a second system.

Generally this topic may be called mobility management. Some straight forward approaches to mobility management have been discussed including, for example, at a subscriber unit simply keying up and transmitting some inquiry type message and waiting to determine whether any network responds each and every time your unit is powered up or each time a data channel you are operating on becomes unsatisfactory. Unfortunately this is unsatisfactory because it wastes valuable system capacity without delivering any data messages and further consumes a significant amount of battery capacity if the subscriber unit is battery powered, such as in the case of a portable unit. Additionally, due to the large number of potential channels or frequencies as well as data protocols, the time delay associated with this technique at its most basic renders the approach simply not practical.

Concerns such as these and practical considerations such as the fact that the subscriber unit rather than the network is likely to best know what data communications attributes and geographic particulars best serve the subscriber's needs as well as the economics of manufacturing a 'standard' subscriber unit has resulted in various other mobility management techniques that may be employed by subscriber units. Such techniques include a preloaded list of channels to scan or manually select when the presently used channel no longer provides adequate connectivity and must therefore be exited. Another includes a continual scan of possible frequencies on which to register and operate so that if the present registered channel degrades an undo amount the subscriber unit may exit such channel and may begin registration attempts on the other possible channels or frequencies. All such prior art techniques continue to be unsatisfactory for a generalized subscriber unit, either wasting system capacity, resulting in excess data message delivery latency, or consuming excess power, that is expecting to have data service on any of the plethora of various data communications networks. Clearly an urgent need continues to exist for improved techniques that address mobility management and more particularly methods of making channel acquisition decisions.

BRIEF DESCRIPTION OF THE DRAWINGS

The features of the present invention which are believed to be novel are set forth with particularity in the appended claims. However, the invention together with further advantages thereof, may best be understood by reference to the accompanying drawings wherein:

DETAILED DESCRIPTION OF A PREFERRED EMBODIMENT

Figure 1:
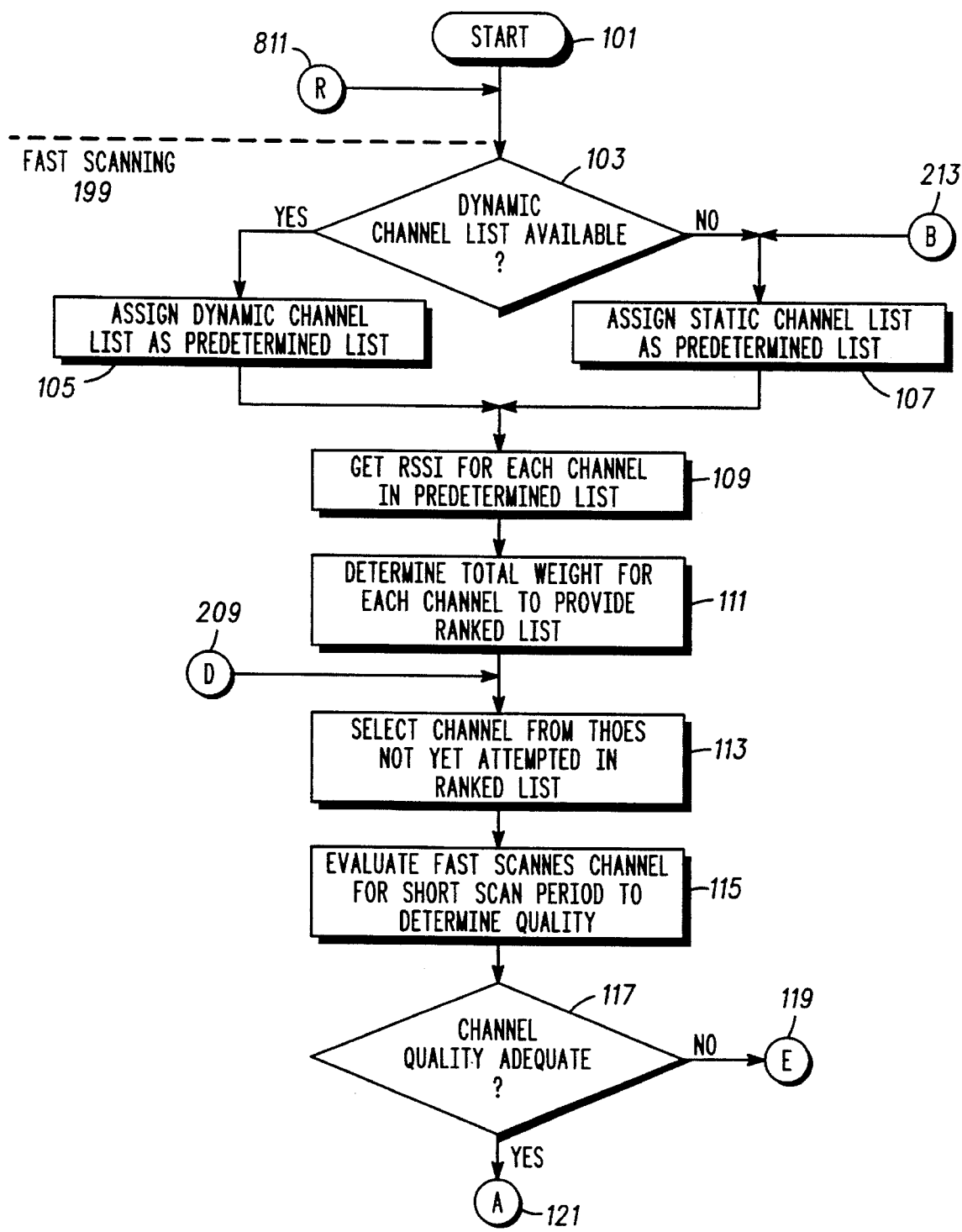
FIG. 1 through FIG. 8 are a demonstrative flow chart of a preferred method of channel acquisition in accordance with the instant invention.
Figure 2:
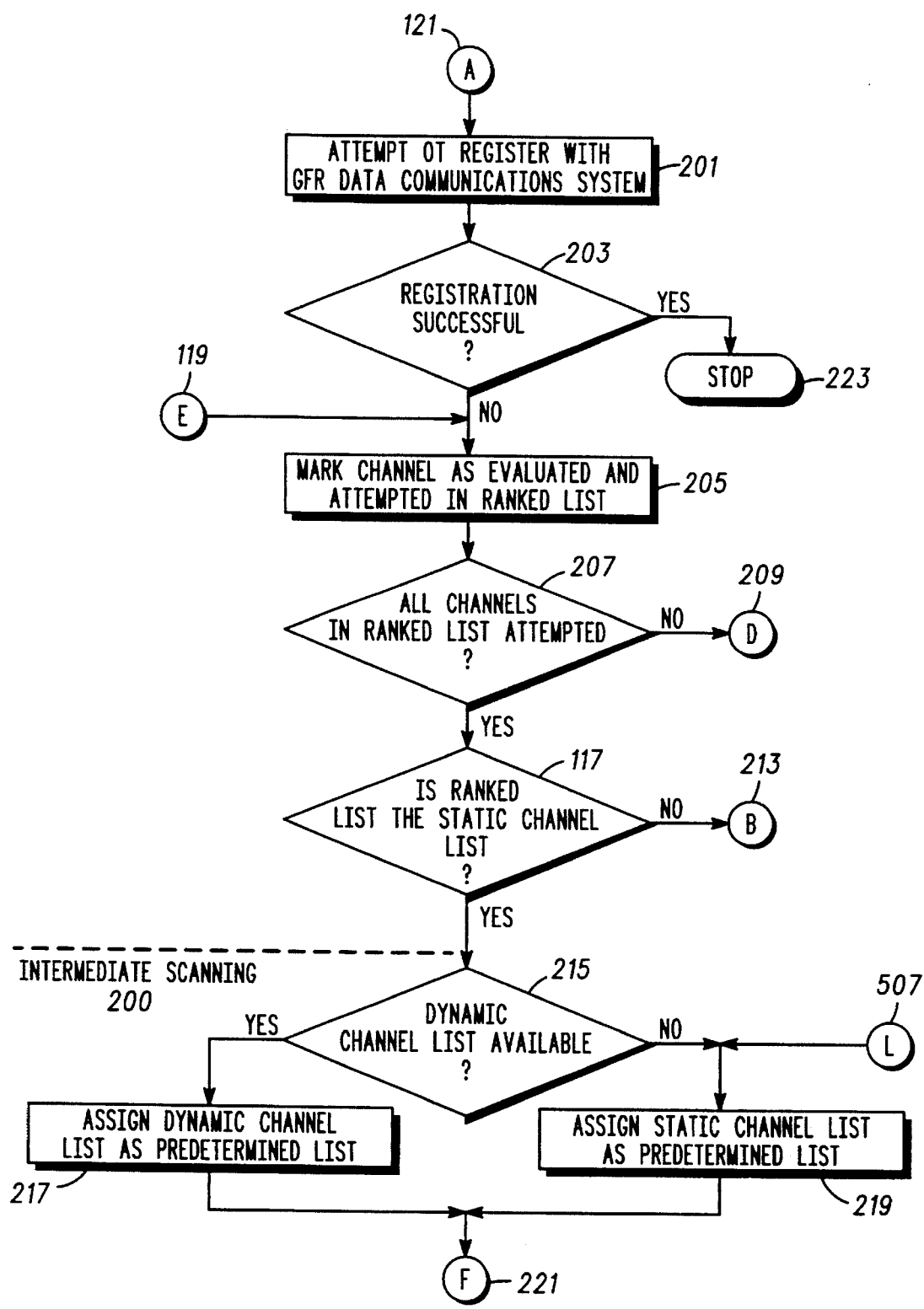

Generally the instant disclosure deals with methods of acquiring, at a subscriber unit, a channel on which to provide data service in a general frequency reuse data communications system. The algorithm chosen will have a major impact on the degree of utility exhibited by a subscriber unit or terminal depending on the level of complexity of the various data systems encountered.

One embodiment set in a general frequency reuse data communications system including infrastructure and a subscriber terminal is a method of acquiring a channel at the subscriber terminal that includes: fast scanning a predetermined list of data channels to identify a fast scanned channel; intermediate scanning, when the fast scanned channel is not identified, the predetermined list of channels to identify an intermediate scanned channel where a channel from the predetermined list of channels is evaluated for a first time period; and slow scanning, when the intermediate scanned channel is not identified, the predetermined list of channels to identify a slow scanned channel where a channel from the predetermined list of channels is evaluated for a second time period.

Fast scanning may further include a step of assigning a weight to each channel in the predetermined list of channels and then ranking the each channel in accordance with the weight to provide a ranked list of channels. Assigning the weight may further include using a received signal strength indication (RSSI) corresponding to the each channel as well as other channel attributes. Fast scanning may use a dynamic channel list and then a static channel list either of which may be weighted and ranked to provide a corresponding ranked channel list. The method may further include an attempt to register on the fast scanned channel.

Intermediate scanning the predetermined list of channels, preferably a dynamic list or a static list, for a intermediate scanned channel may include a step of assigning a pseudo weight to each channel and ranking said each channel in accordance with said pseudo weight and other channel attributes to provide a ranked channel list that is then scanned starting with the highest ranked channel. When the intermediate scan identifies an intermediate scanned channel the method further includes a step of attempting to register on a station having a predetermined level of outbound activity on the intermediate scanned channel. If the attempt is unsuccessful a step of re-attempting to register on alternative stations operating on the intermediate scanned channel may be undertaken. The intermediate scan may further be limited to a scan time period.

Slow scanning for the second time period, preferably utilizes a time period that exceeds a maximum channel idle time period and may further include slow scanning a dynamic channel list and a static channel list. If slow scan is completed without success the step of fast scanning is repeated.

Alternatively, in a similar setting at a subscriber terminal suitable for operation on multi-frequency reuse and single frequency reuse data systems a method of acquiring an operating channel at the subscriber terminal includes: fast scanning a predetermined list of data channels to identify an acceptable channel; intermediate scanning, when the acceptable channel is not identified, the predetermined list of channels to identify an intermediate scanned channel where a channel from the predetermined list of channels is evaluated for a first time period; and slow scanning, when the intermediate scanned channel is not identified, the predetermined list of channels to identify a slow scanned channel where a channel from the predetermined list of channels is evaluated for a second time period.

Fast scanning further includes a step of attempting to register on the acceptable channel. Intermediate scanning is initiated when the step of attempting is unsuccessful and intermediate scanning may include repeating the step of fast scanning followed by intermediate scanning for a first time period each channel of the predetermined list of channels subject to a scan time limit and identification of the scanned channel.

Figure 9:
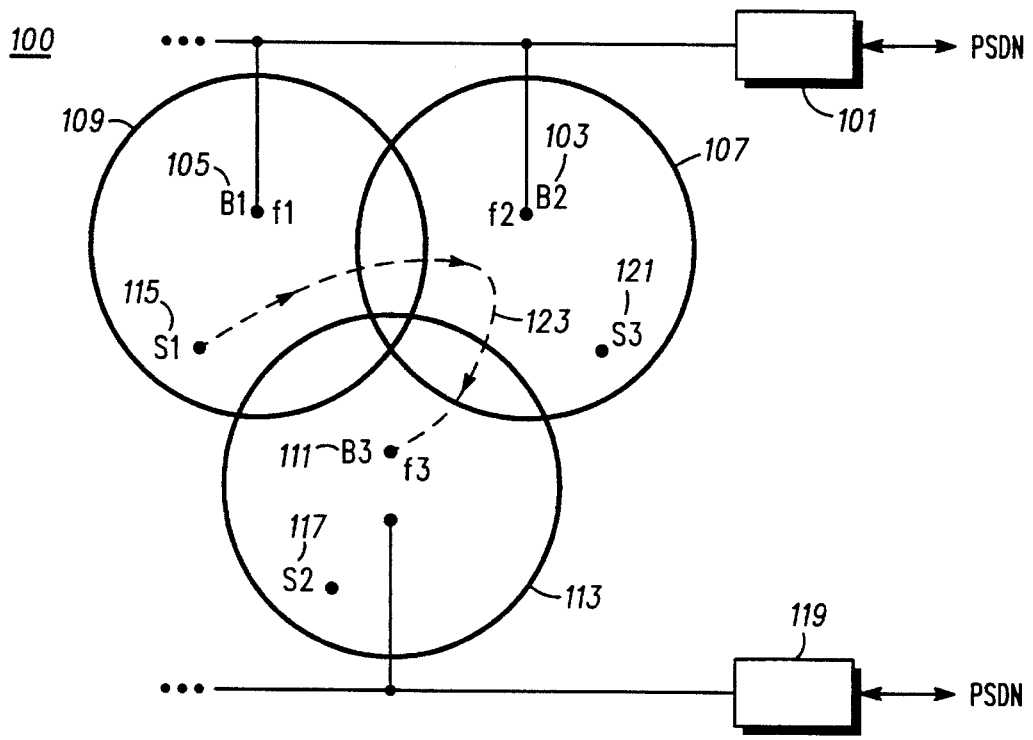
FIG. 9 is a representative diagram of a data communications system suited for employing the methods of FIG. 1 through FIG. 8.

The instant invention may be more fully developed and appreciated with reference to the figures in which FIG. 9 depicts a representative diagram of a data communications system suitable for employing a method of making a channel acquisition decision in accordance with the present invention. The FIG. 9 data communications system depicts a first infrastructure 100 including a first network controller 101 that is coupled to a public switched data network (PSDN), such as the public switched telephone network, and to one or more base stations, such as base stations B1, B2, etc. 105, 103, etc. Exemplary versions of all equipment are available from suppliers or manufacturers such as Motorola Inc.

Generally the network controller controls the network or infrastructure and coordinates the delivery and receipt of messages to and from the base stations B1 and B2 and their respective origins and destinations. B1 105 has a geographic coverage area 109 within which it may deliver and receive messages from subscriber units, such as subscriber unit S1 115. The subscriber units are available from various manufacturers such as Motorola Inc. under various trade names such as InfoTac. Similarly B2 103 has a geographic coverage area 107 within which it may deliver and receive messages from subscriber units, such as S3 or S1 as S1 travels along the representative path 123. Similarly network controller 119 is coupled to the PSDN and a base station B3 111 and coordinates data message traffic on its respective infrastructure. B3 provides coverage over an area 113 and may provide service to subscriber units, such as S2 117 or S1 115 as it travels along path 123. The base stations B1 and B2 may operate on distinct frequencies f1 and f2 and be part of a multi-frequency reuse system while base station B3 may operate on f3 and be part of a single frequency reuse system. It is understood that FIG. 9 necessarily is a much simplified representative diagram and that actual systems are far more complicated.

For purposes of further explanation with reference to the FIGS. 1–8 flow chart, consider the situation observed by the subscriber unit S1 115 as it traverses the representative path 123. By observation B1 will initially be best able to provide service, then either B1 or B2, then B2 only, then B2 and B3, and eventually only B3. From time to time S1 will need to make one or more data channel exit decisions as well as select another data channel to subsequently register on.

Referring to FIG. 1 a preferred method embodiment of channel acquisition at the subscriber unit 115 as it traverses the path 123 in the communications system of FIG. 1 will be described. This method is suitable for execution by any general purpose or special purpose processor (not specifically shown but included as part of the subscriber unit) that has been programmed with the appropriate software and is interfaced with or controlling a receiver arranged to receive signals and assess signal strength, etc. This method begins at step 101 where the subscriber unit commences fast scanning 100 a predetermined list of data channels to identify a fast scanned channel. In fast scanning the subscriber unit evaluates each channel in the predetermined list for a first time period, i.e. the short scan period, only once in ranked order. Fast scanning is primarily intended to a acquire a continuously-keyed channel or intermittently-keyed channel with a high transmit duty cycle. The fast scanned channel is identified by determining whether the subscriber unit possesses a dynamic channel list at step (103), a channel list received by the subscriber unit from the infrastructure 100. If a dynamic channel list does exist, then the subscriber unit assigns it as the predetermined list at step (105); if not, then the subscriber unit assigns the static channel list which permanently resides in the unit as the predetermined list at step (107).

Next, the subscriber unit assigns a weight to each channel in the predetermined list. In this embodiment the subscriber unit establishes the weight for the each channel in the predetermined list as follows: It determines the received signal strength indication (RSSI) for each channel in the predetermined list at step (109). Then, for each channel in the predetermined list, it determines the weight by combining the RSSI and predefined weights associated with each attribute of the channel as defined in the predetermined list at step (111). These attributes may include but are not limited to priority (high/low), transmitter class (continuously-keyed/intermittently-keyed), coverage class (mobile/portable), and relative geographic coverage (overlapping/non-overlapping). Computing the weight for the each channel in the predetermined list effectively provides a ranked list of channels.

The subscriber unit now at step (113) selects the best channel from the ranked list. Where more than one channel of comparable ranking exists, the subscriber unit randomly selects one of those channels to avoid selecting the same channel as other subscriber units based on the order of the channels in the ranked list. The selected channel is the fast scanned channel.

The subscriber unit evaluates the outbound channel or frequency of the fast scanned channel for one short scan period at step (115) to determine its quality. The quality of the outbound frequency is considered to be representative of the quality of the inbound channel or frequency. The quality metric may include but is not limited to bit error rate or symbol error rate. The characteristics of the RF protocol will determine the possible set of such factors in the quality metric. Next, the subscriber unit determines whether the quality is adequate at step (117). If yes, the method proceeds to FIG. 2 at 121 where the subscriber unit attempts to register with the data communications network at step (201). If no, the method proceeds to FIG. 2 at 119 where the subscriber unit continues the channel selection and evaluation process. The particular RF protocol may require the subscriber unit to determine the path, i.e. particular origin, of the channel in order to generate the actual registration request. The path may include but is not limited to the country code, system identification, RF subnetwork identification, and base station identification of the channel. The subscriber unit transmits the registration request and waits for the infrastructure to acknowledge receipt of the request. If the RF protocol dictates an automatic retry request mechanism, then the subscriber unit attempts to transmit the registration request again as so dictated.

If the subscriber unit successfully registers with the infrastructure as tested at step (203), then the method of acquiring the channel is complete and stops at step (223). The subscriber unit may then use the channel in accordance with the RF protocol to transmit and receive data to and from the infrastructure in the data communications system.

If the subscriber unit does not successfully register with the infrastructure or had previously determined that the quality of the fast scanned channel was not adequate see (119) from FIG. 1, then it marks the channel as evaluated and attempted in the ranked list at step 205.

Next, the subscriber unit determines whether all of the channels in the ranked list have been attempted at step (207). If no see (209), then the subscriber unit selects the next channel in the ranked list to evaluate at step (113). If yes, then the subscriber unit determines whether the ranked list was derived from the static channel list at step (211). If the ranked list was not derived from the static channel list see (213), then the method returns to FIG. 1 where the subscriber unit assigns the static channel list as the predetermined list at step (107) and performs the fast scanning method again; if yes, then the subscriber unit commences intermediate scanning 200. Intermediate scanning is undertaken when a fast scanned channel is not identified and seeks to identify an intermediate scanned channel within the predetermined list while evaluating each channel in the list for a first time period. In intermediate scanning the subscriber unit evaluates each channel in the predetermined list in ranked order repeatedly for a third time period, i. e. the intermediate scan period, or until every channel has been unsuccessfully attempted. Intermediate scanning is primarily intended to acquire an intermittently keyed channel with at least a moderate transmit duty cycle. The minimum transmit duty cycle for which intermediate scanning is statistically effective is dependent on the first time period, the third time period, and the number of channels in the predetermined list.

The subscriber unit determines whether it possesses a dynamic channel list at step (215). If a dynamic channel list does exist, then the subscriber unit assigns it as the predetermined list at step (217); if not, then the subscriber unit assigns the static channel list which permanently resides in the unit as the predetermined list at step (219).

Figure 3:
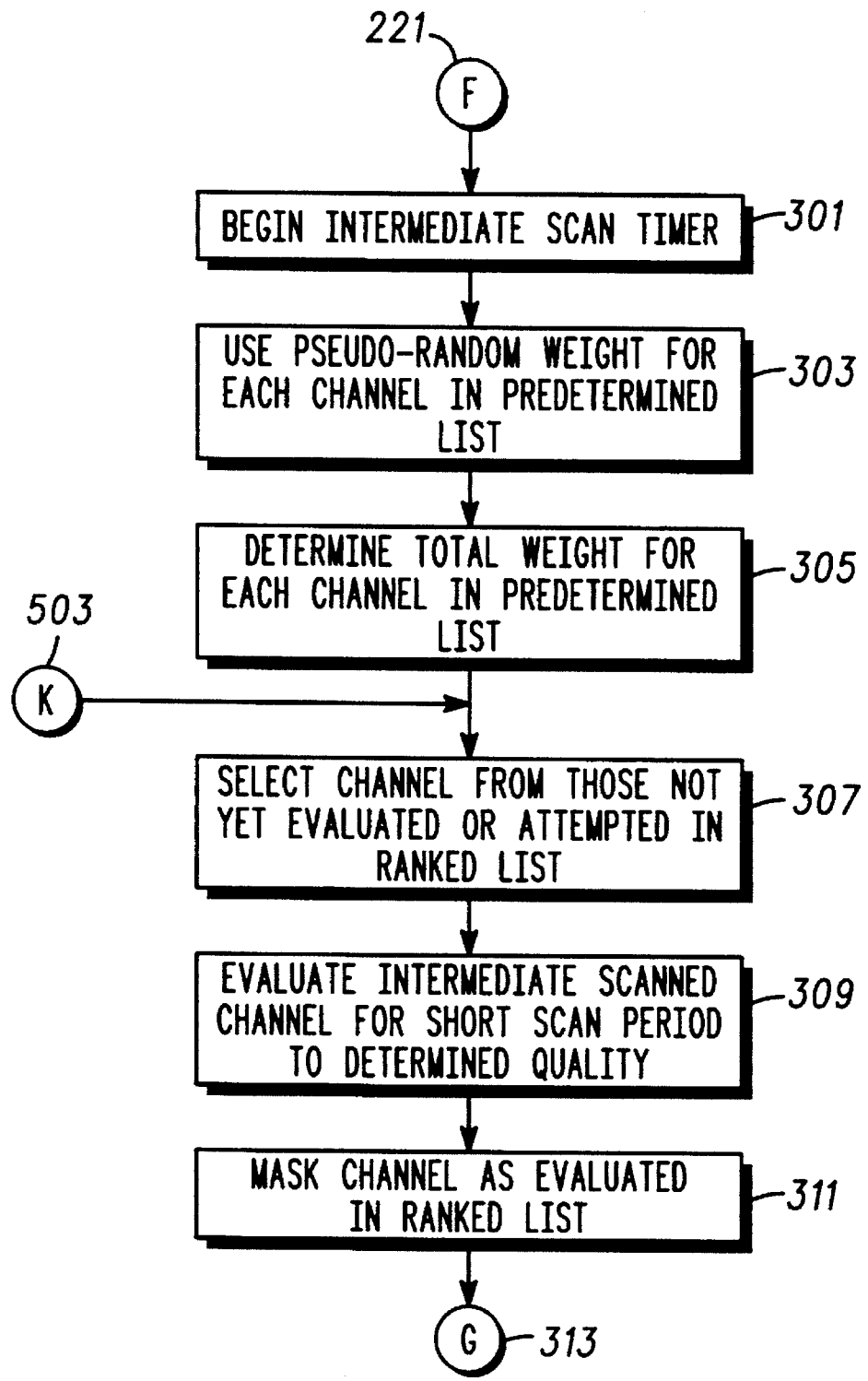
Figure 4:
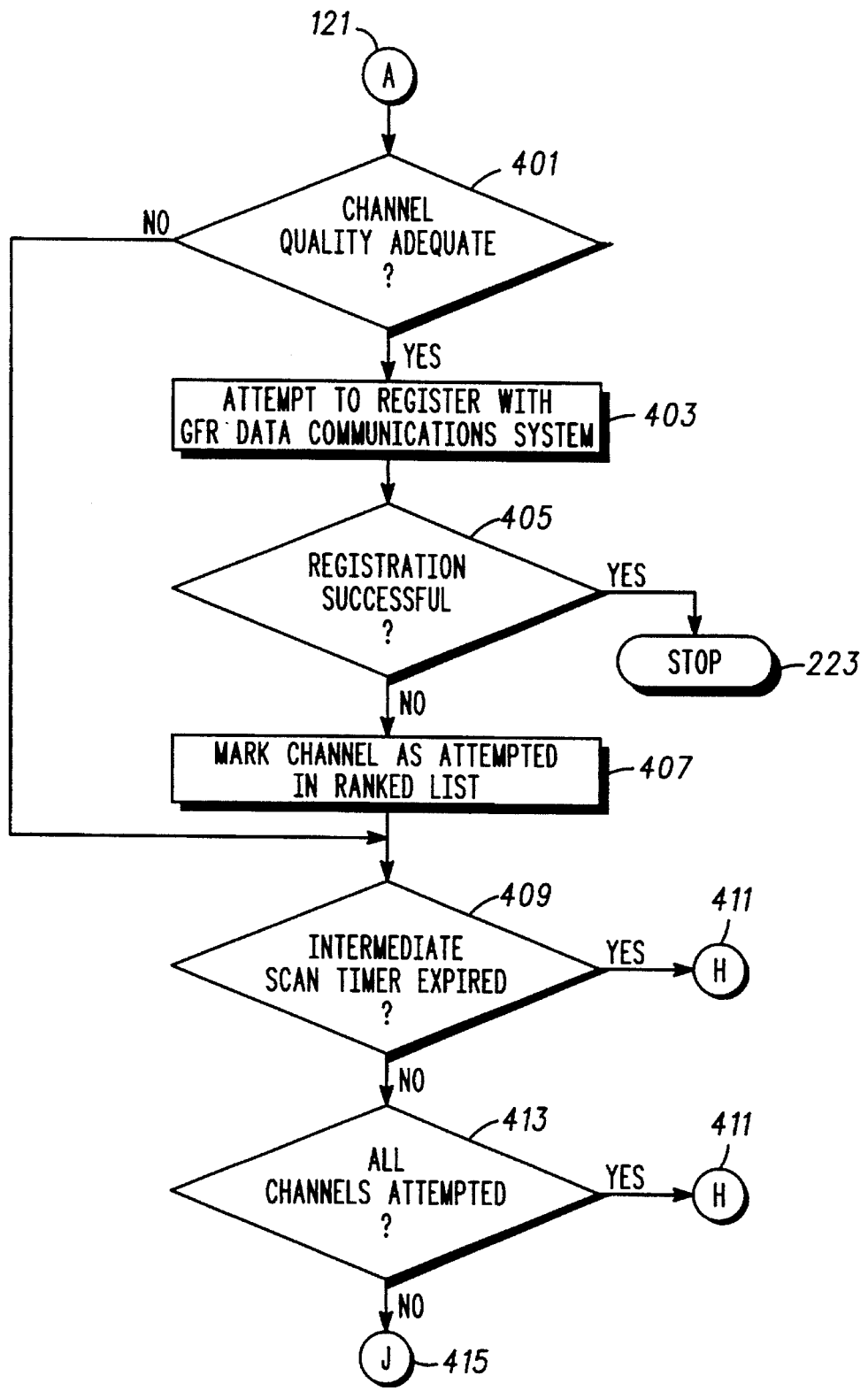

The method then proceeds 221 to FIG. 3 where next, the subscriber unit starts the intermediate scan timer at step (301). As described below, intermediate scanning continues until the intermediate scan timer expires after a third time period or all of the channels in the predetermined list have been unsuccessfully attempted to register, whichever comes first.

The subscriber unit assigns a weight to each channel in the predetermined list. In this embodiment the subscriber unit establishes the weight for the each channel in the predetermined list as follows: It chooses a pseudo-random weight to be used for the each channel in the predetermined list at step (303). Then, for the each channel in the predetermined list, it determines the weight by combining the pseudo-random weight and predefined weights associated with each attribute of the channel as defined in the predetermined list (305). Computing the weight for the each channel in the predetermined list effectively provides a ranked list of channels.

The subscriber unit now selects the best channel from the ranked list which has not yet been evaluated or attempted at step (307). Where more than one channel of comparable ranking exists, the subscriber unit randomly selects one of the channels to avoid selecting the same channel as other subscriber units based on the order of the channels in the ranked list. The selected channel is the intermediate scanned channel.

The subscriber unit evaluates the outbound channel or frequency of the intermediate scanned channel for one short scan period to determine its quality at step (309). The quality of the outbound frequency is considered to be representative of the quality of the inbound channel or frequency. The subscriber unit marks the channel as having been evaluated in the ranked list (311) and the method proceeds 313 to FIG. 4. Next, the subscriber unit determines whether the quality is adequate at step (401). If yes, then the subscriber unit attempts to register with the data communications network on this intermediate scanned channel at step (403); if no, then the subscriber unit continues the channel selection and evaluation process at step (409).

If the subscriber unit successfully registers with the infrastructure at step (405), then the method to acquire the channel is complete and stops at step (223). The subscriber unit may then use the channel in accordance with the RF protocol to transmit and receive data to and from the infrastructure in the data communications system.

If the subscriber unit does not successfully register with the infrastructure, then it marks the channel as attempted in the ranked list at step (407). Next, the subscriber unit determines whether the intermediate scan timer has expired at step (409). If yes, then the method proceeds to FIG. 5 at 411 where the subscriber unit selects the next list; if no, then the subscriber unit determines whether all of the channels in the ranked list have been attempted unsuccessfully to register at step (413).

Figure 5:
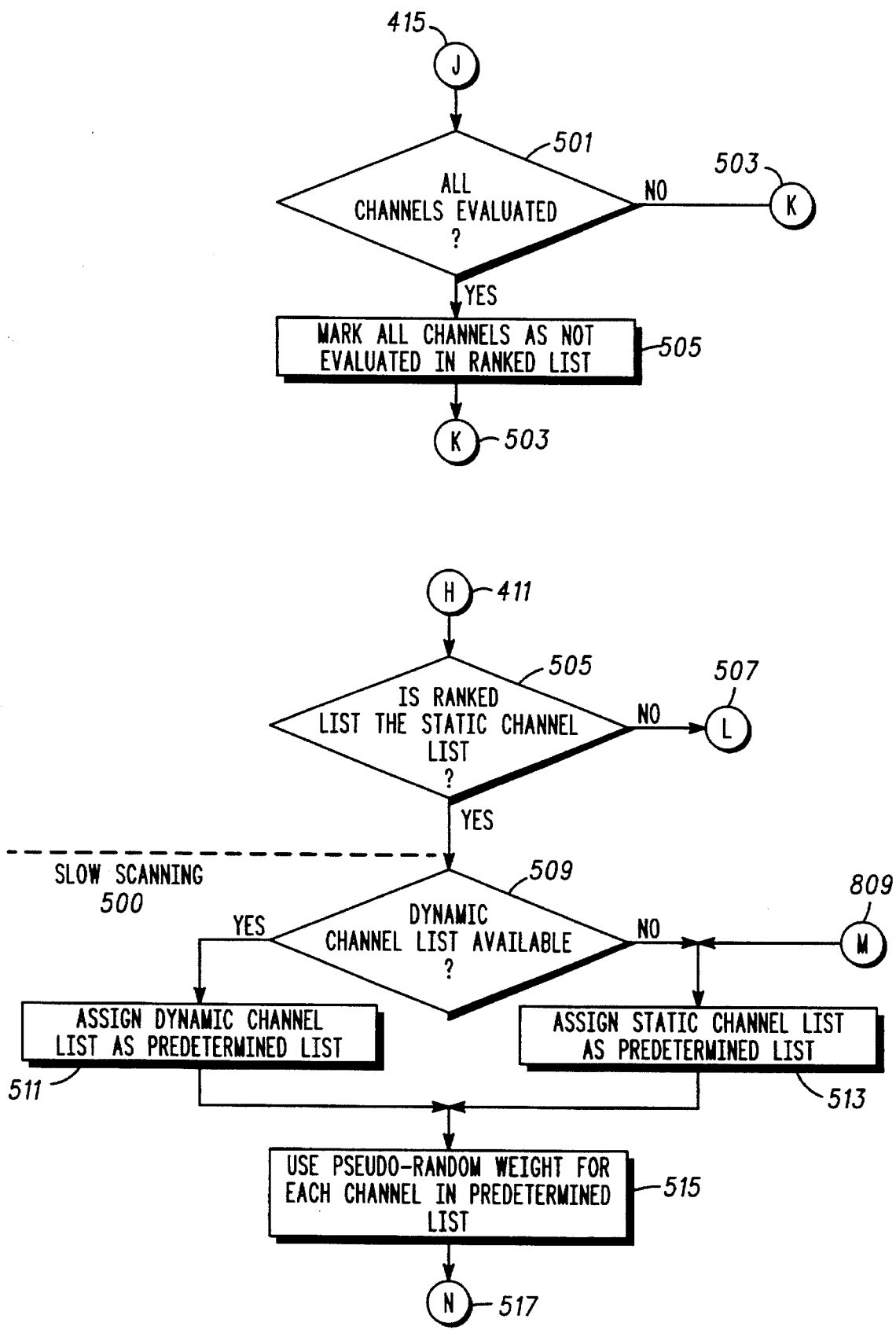
Figure 6:
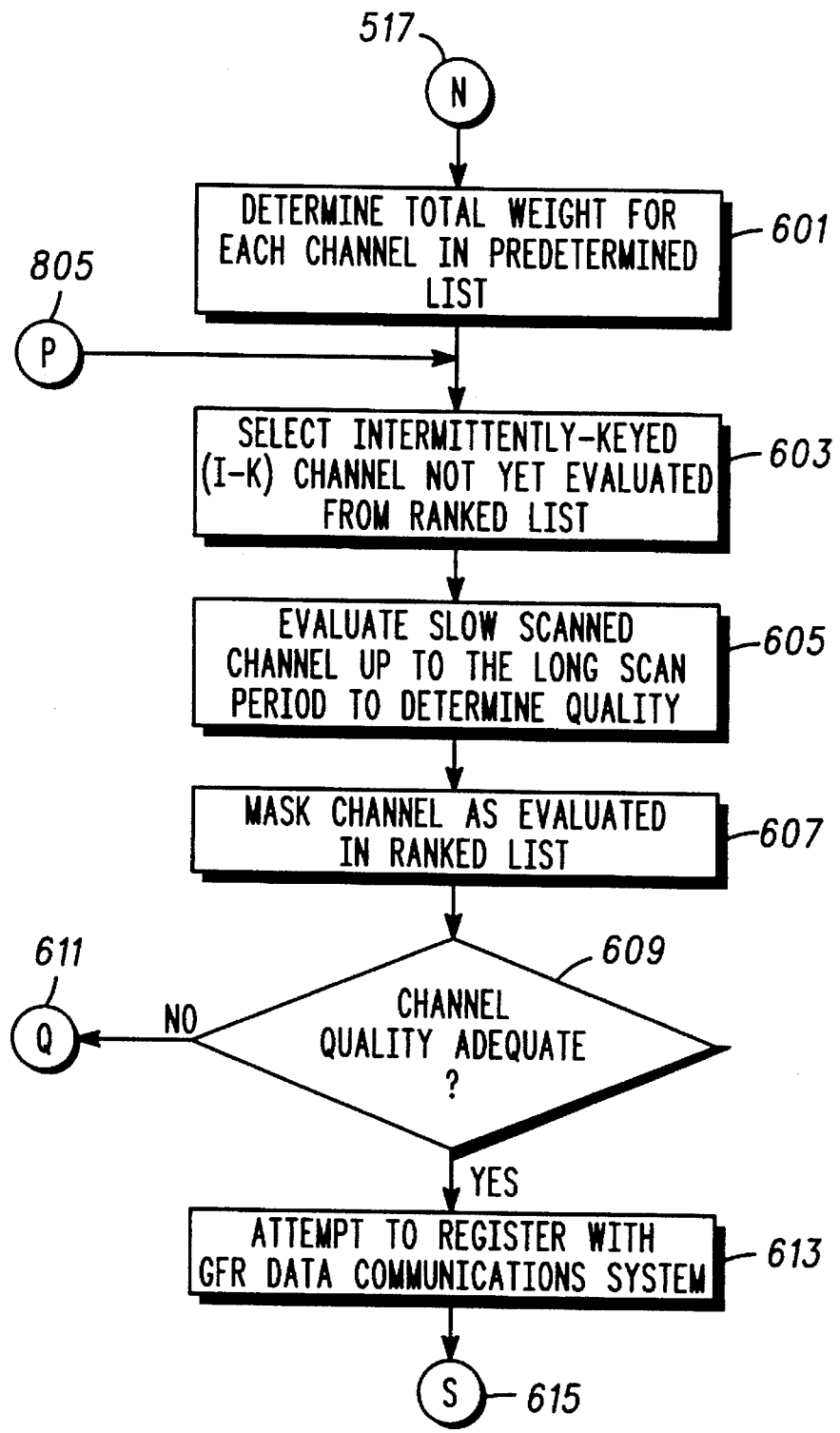
Figure 7:
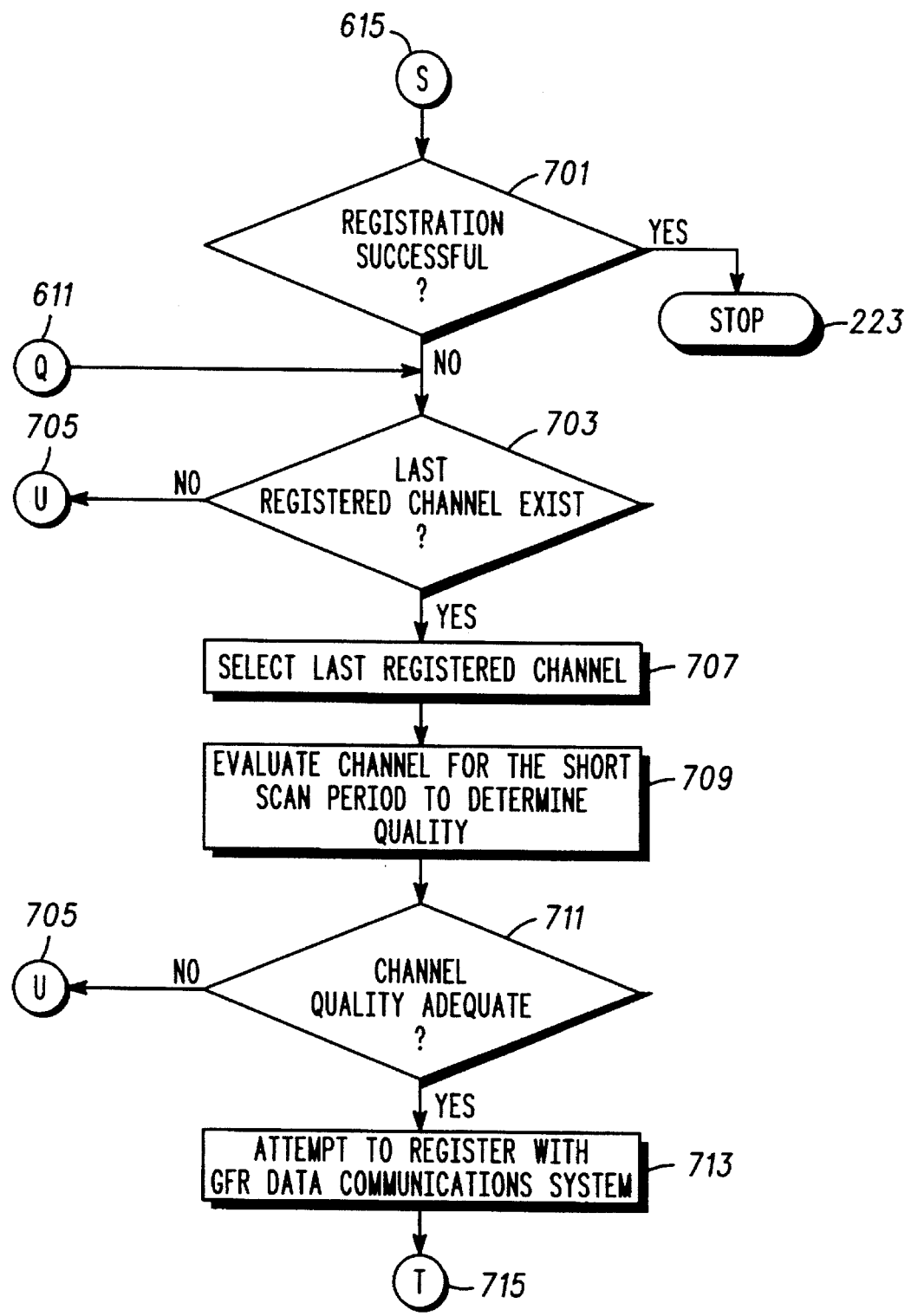
Figure 8:
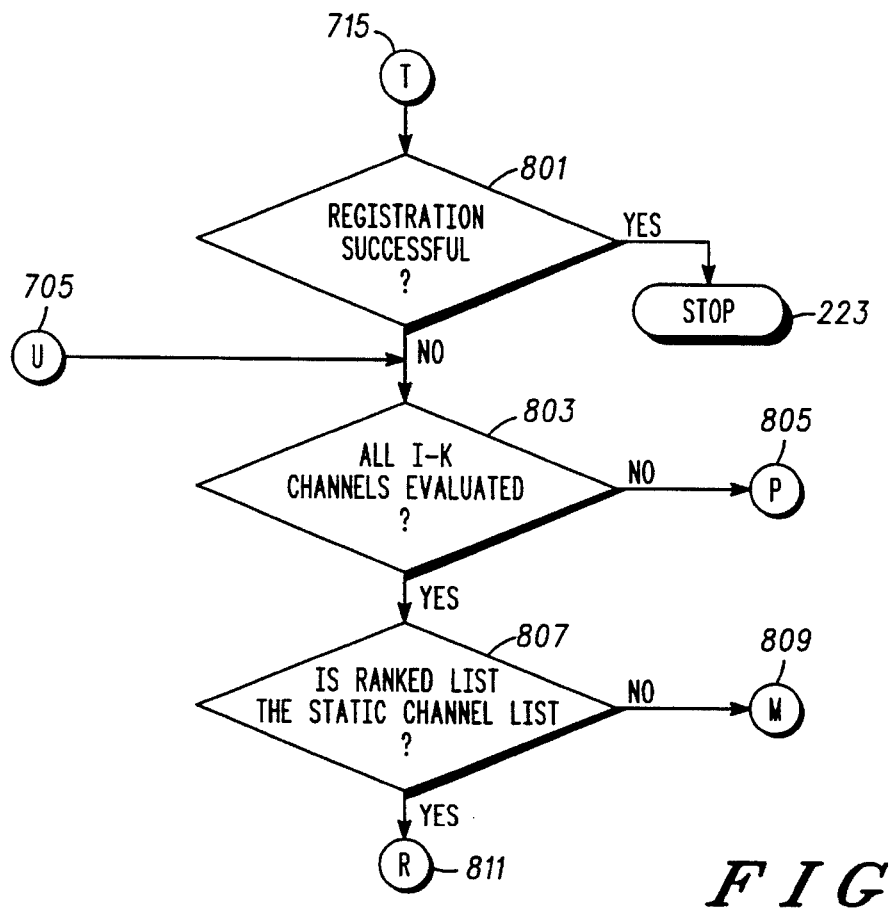

If all of the channels have been attempted, then the method proceeds to FIG. 5 at (411); if not the method proceeds to FIG. 5 at (415), where the unit determines whether all of the channels in the ranked list have been evaluated at step (501). If not all channels in ranked list have been evaluated as tested at step (501), the method returns 503 to step (307) where the subscriber unit selects the next channel in the ranked list to evaluate; if yes, then the subscriber unit marks all of the channels in the ranked list as not having been evaluated (505) and proceeds to select the next channel in the ranked list to evaluate at step (307).

If the intermediate scan timer has expired or all of the channels in the ranked list have been attempted unsuccessfully (see 411), the subscriber unit determines whether the ranked list was derived from the static channel list at step (506). If the ranked list was not derived from the static channel list the method proceeds to FIG. 2 at 507, where the subscriber unit assigns the static channel list as the predetermined list at step (219) and performs the intermediate scanning method again beginning at 221 in FIG. 3; if yes, then the subscriber unit commences slow scanning 500. Slow scanning occurs when an the intermediate scan did not identify a channel and includes slow scanning a predetermined list of channels to identify a slow scanned channel where the channels are each evaluated for a second time period that, preferably, exceeds a maximum quiet period of time. In slow scanning the subscriber unit evaluates each intermittently-keyed channel in the predetermined list only once in ranked order. Slow scanning is primarily intended to acquire an intermittently-keyed channel with even the minimum transmit duty cycle.

The subscriber unit determines whether it possesses a dynamic channel list at step (509). If a dynamic channel list does exist, then the subscriber unit assigns it as the predetermined list at step (511); if not, then the subscriber unit assigns the static channel list which permanently resides in the unit as the predetermined list at step (513).

The subscriber unit assigns a weight to each channel in the predetermined list. In this embodiment the subscriber unit establishes the weight for the each channel in the predetermined list as follows: It chooses a pseudo-random weight to be used for each channel in the predetermined list at step (515). Then the method proceeds to FIG. 6 at 517, where for the each channel in the predetermined list, it determines the weight by combining the pseudo-random weight and predefined weights associated with each attribute of the channel as defined in the predetermined list at step (601). Computing the weight for each channel in the predetermined list effectively provides a ranked list of channels.

The subscriber unit now selects the best intermittently-keyed channel from the ranked list which has not yet been evaluated at step (603). Only intermittently-keyed channels are considered since continuously-keyed channels should have been observed during either of the previous scanning procedures. An additional benefit is that the slow scanning duration is minimized. Where more than one channel of comparable ranking exists, the subscriber unit randomly selects one of these channels to avoid selecting the same channel as other subscriber units based on the order of the channels in the ranked list. The selected channel is the slow scanned channel.

The subscriber unit evaluates the outbound channel or frequency of the slow scanned channel for one long scan period at step (605) to determine its quality. The duration of the long scan period exceeds the (predefined) maximum channel idle time period. The quality of the outbound frequency is considered to be representative of the quality of the inbound channel or frequency. The subscriber unit marks the channel as having been evaluated in the ranked list at step (607). Next, the subscriber unit determines whether the quality is adequate at step (609). If yes, then the subscriber unit attempts to register with the data communications network on the slow scanned channel at step (613) and the method proceeds to FIG. 7 at 615; if no, then the subscriber unit continues the channel selection and evaluation process (see 611).

If the subscriber unit successfully registers with the infrastructure as tested at step (701), then the method to acquire the channel is complete and stops at step (223). The subscriber unit may then use the channel in accordance with the RF protocol to transmit and receive data to and from the infrastructure in the data communications system.

If the subscriber unit does not successfully register with the infrastructure or the quality was not adequate (see 611), then it determines whether it possesses the last registered channel at step (703). Because slow scanning can be of potentially long duration (several minutes in this embodiment) and because the last registered channel is the most likely channel to be available, the last registered channel is evaluated repeatedly throughout slow scanning in hopes of minimizing the duration of this method. If available, the subscriber unit selects the last registered channel at step (707) and evaluates it for the short scan period to determine its quality at step (709). Next, the subscriber unit determines whether the quality of the channel is adequate at step (711). If yes, then the subscriber unit attempts to register with the data communications network at step (713) and the method proceeds at 715 to FIG. 8; if no, then the subscriber unit continues the channel selection and evaluation process at 705 in FIG. 8.

If the subscriber unit successfully registers with the infrastructure as tested at step (801), then the method to acquire the channel is complete and stops at step (223). The subscriber unit may then use the channel in accordance with the RF protocol to transmit and receive data to and from the infrastructure in the data communications system.

If the subscriber unit does not successfully register with the infrastructure or the quality was not adequate (see 705), then it determines whether all of the intermittently-keyed channels in the ranked list have been evaluated at step (803). If no the method proceeds back to FIG. 6 at 805, where the subscriber unit selects the next channel in the ranked list to evaluate at step (603); if yes, then it determines whether the ranked list was derived from the static channel list at step (807). If the ranked list was not derived from the static channel list the method proceeds back to FIG. 5 at 809, where the subscriber unit assigns the static channel list as the predetermined list at step (513) and performs the slow scanning method again; if yes the method proceeds back to FIG. 1 at 811, where the subscriber unit commences fast scanning 100 again. In the interest of conserving battery power and thereby extending battery life if that is of concern, e.g. a portable subscriber unit, then the method might pause at this point from some extended period before resuming fast scanning.

The various timers and other parameters are specific to the RF protocol and the preferences of the network operator, however, we have determined the values of these parameters experimentally for a 19.2 kbps Radio Data Link Access Procedure (RD-LAP) data communications system as defined in the RD-LAP Air Interface Specification, Release 2.2, March, 1992.

The channel attribute weights used to determine the weight for a channel and therefore its rank in the predetermined list (see steps 111, 305, 601) are as follows: priority is four, coverage class is three, transmitter class is two, and same RF subnetwork is one. Adequate channel quality is nominally equivalent to a ten percent block error rate, or packet error rate where the packet is one block in length (see steps 117, 401,609, 711).

The short scan period used to evaluate a fast scanned or intermediate scanned channel (see steps 115, 309) is nominally one second. The intermediate scan timer used to determine the worst case duration of intermediate scanning for a predetermined list (see step 301) is 55 seconds. The slow scan period used to evaluate a slow scanned channel (see step 605) is 42 seconds.

While the FIG. 1 through FIG. 8 channel acquisition methods demonstrate preferred embodiments it will be clear to those of ordinary skill in the art that many variants within the true scope and spirit of the instant invention are possible. Such variants that provide the sought after advantages of the instant invention, including, for example, on average shorter channel acquisition latency and the advantages that flow there from such as greater operator convenience, improved battery life and increased system capacity will likely depend on the particular parameters chosen for the scanning or channel acquisition method in conjunction with the particulars of the data communications system. As one of but two examples, consider a subscriber terminal that intends to operate largely on a SFR normally quite system that is located among multiple MFR systems. Such a unit likely would not want to spend very much time looking at MFR channels where it may not be authorized and would thus prefer to fall through the method to the slow scan portion as quickly as possible.

In contrast consider a subscriber unit that routinely operates in either of two distant locations one served by an MFR system and one served by an SFR system. For such a unit it may well be that the method described herein is well suited for minimizing average channel acquisition latency. The optimum parameters for a specific subscriber or perhaps even a specific system may thus be dependent on the actual usage patterns that are circumstance dependent. All such variants that take advantage of the adaptive channel acquisition methods for subscriber units as taught by the instant invention are considered to be within the true scope and spirit of the same.

It will be appreciated by those of ordinary skill in the art that the methods disclosed provide various advantageous methods of acquiring a channel at a subscriber unit operating in a general frequency reuse data communications system. These inventive methods may be readily and advantageously employed in a subscriber terminal or other communications device or system to minimize channel acquisition latency on a unit by unit basis, without otherwise sacrificing network service characteristics. Hence, the present invention, in furtherance of satisfying a long-felt and growing (given the proliferation of data systems and thus potential operating channels) need for improved channel acquisition latency, provides an exemplary method of channel acquisition that adapts to usage and service patterns on a terminal by terminal basis thus significantly reducing average channel acquisition latency for many terminals.

It will be apparent to those skilled in the art that the disclosed invention may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. In a general frequency reuse data communications system including infrastructure and a subscriber terminal a method of acquiring a channel at the subscriber terminal including the steps of:

fast scanning a predetermined list of data channels to identify a fast scanned channel;

further scanning, when said fast scanned channel is not identified, said predetermined list of channels repeatedly for a time not exceeding an intermediate scan period to identify an intermediate scanned channel where a channel from said predetermined list of channels is evaluated for a first time period shorter than the intermediate scan period; and slow scanning, when said intermediate scanned channel is not identified, at least selected channels from said predetermined list of channels to identify a slow scanned channel where a channel from said predetermined list of channels is evaluated for a second time period longer than said first time period.

2. The method of claim 1 wherein said step of fast scanning to identify a fast scanned channel further includes a step of assigning a weight to each channel in said predetermined list of channels.

3. The method of claim 2 wherein said step of fast scanning further includes a step of ranking said each channel in accordance with said weight to provide a ranked list of channels.

4. The method of claim 2 wherein said step of assigning said weight further includes using a received signal strength indication (RSSI) corresponding to said each channel.

5. The method of claim 4 wherein said step of assigning said weight further includes using other channel attributes corresponding to said each channel.

6. The method of claim 1 wherein said step of fast scanning further includes fast scanning a dynamic channel list and then fast scanning a static channel list.

7. The method of claim 6 wherein said step of fast scanning a dynamic channel list further includes a step of assigning a weight to each channel in said dynamic channel list.

8. The method of claim 7 wherein said step of fast scanning further includes a step of ranking said each channel in accordance with said weight to provide a ranked dynamic channel list.

9. The method of claim 7 wherein said step of assigning said weight further includes using a received signal strength indication (RSSI) corresponding to said each channel.

10. The method of claim 8 wherein said step of assigning said weight further includes using other channel attributes corresponding to said each channel.

11. The method of claim 1 wherein said step of fast scanning said predetermined list of data channels to identify a fast scanned channel further includes an attempt to register on said fast scanned channel.

12. The method of claim 1 wherein said step of further scanning includes a step of assigning a pseudo weight to each channel and ranking said each channel in accordance with said pseudo weight and other channel attributes to provide a ranked channel list.

13. The method of claim 12 wherein said step of further scanning includes scanning said ranked channel list starting with a highest ranked channel.

14. The method of claim 13 wherein said step of further scanning said ranked channel list further includes a step of attempting to register on a station having a predetermined level of outbound activity on said intermediate scanned channel.

15. The method of claim 14 wherein said step of attempting further includes re attempting to register on alternative stations operating on said intermediate scanned channel when said step of attempting to register is unsuccessful.

16. The method of claim 1 wherein said step of slow scanning for said second time period utilizes a time period that exceeds a maximum channel idle time period.

17. The method of claim 16 wherein said step of slow scanning further includes slow scanning a dynamic channel list and a static channel list.

18. The method of claim 17 wherein said step of fast scanning is repeated when said step of slow scanning fails to identify a slow scanned channel.

19. In a data communications system including infrastructure and a subscriber terminal suitable for operation on multi-frequency reuse and single frequency reuse data systems a method of acquiring an operating channel at the subscriber terminal including the steps of:

fast scanning a predetermined list of data channels to identify an acceptable channel;

scanning, when said acceptable channel is not identified, said predetermined list of channels repeatedly for a time not exceeding an intermediate scan period to identify an intermediate scanned channel where a channel from said predetermined list of channels is evaluated for a first time period shorter than the intermediate scan period; and slow scanning, when said intermediate scanned channel is not identified, said second predetermined list of channels to identify a slow scanned channel where a channel from said predetermined list of channels is evaluated for a second time period longer than said first time period.

20. The method of claim 1 wherein said step of fast scanning further includes a step of attempting to register on said acceptable channel.

21. The method of claim 20 wherein said step of further scanning is initiated when said step of attempting is unsuccessful.

22. The method of claim 21 wherein said step of intermediate scanning further includes a step of repeating said step of fast scanning followed by intermediate scanning for a first time period each channel of said predetermined list of channels subject to an identification of said scanned channel.

23. In a general frequency reuse data communications system including infrastructure and a subscriber terminal a method of acquiring a channel at the subscriber terminal including the steps of:

fast scanning a predetermined list of continuously-keyed and intermittently-keyed data channels once to identify a fast scanned channel;

further scanning, when said fast scanned channel is not identified, said predetermined list of channels repeatedly for a time not exceeding an intermediate scan period, to identify an intermediate scanned channel where a channel from said predetermined list of channels is evaluated for a first time period shorter than the intermediate scan period; and slow scanning, when said intermediate scanned channel is not identified, intermittently-keyed channels of said predetermined list of channels to identify a slow scanned channel where an intermittently-keyed channel from said predetermined list of channels is evaluated for a second time period, longer than said first time period.

24. In a general frequency reuse data communications system including infrastructure and a subscriber terminal a method of acquiring a channel at the subscriber terminal including the steps of:

assigning a weight to each channel in a predetermined list of data channels, using a received signal strength indication (RSSI) corresponding to said each channel and using other channel attributes corresponding to said each channel;

ranking said each channel in accordance with said weight to provide a ranked list of channels;

fast scanning said predetermined list of channels in rank order to identify a fast scanned channel;

further scanning, when said fast scanned channel is not identified, said predetermined list of channels repeatedly to identify an intermediate scanned channel where a channel from said predetermined list of channels is evaluated for a first time period; and slow scanning, when said intermediate scanned channel is not identified, said predetermined list of channels to identify a slow scanned channel where a channel from said predetermined list of channels is evaluated for a second time period, longer than said first time period.

25. The method of claim 24 wherein the step of further scanning further comprises the step of re-ranking said each channel in accordance with predefined weights associated with said channel attributes.

* * * * *